United States Patent
Oh et al.

(10) Patent No.: US 10,566,572 B2
(45) Date of Patent: Feb. 18, 2020

(54) ORGANIC LIGHT-EMITTING DISPLAY DEVICE AND METHOD OF MANUFACTURING THE SAME

(71) Applicant: LG Display Co., Ltd., Seoul (KR)

(72) Inventors: Jae-Young Oh, Goyang-si (KR); Seok-Woo Son, Jeollanam-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/797,304

(22) Filed: Oct. 30, 2017

(65) Prior Publication Data
US 2018/0123086 A1    May 3, 2018

(30) Foreign Application Priority Data
Oct. 31, 2016 (KR) .......... 10-2016-0143975

(51) Int. Cl.
*H01L 51/52* (2006.01)
*H01L 27/32* (2006.01)
(Continued)

(52) U.S. Cl.
CPC ....... *H01L 51/5256* (2013.01); *G09G 3/3241* (2013.01); *H01L 27/3213* (2013.01);
(Continued)

(58) Field of Classification Search
CPC ... H01L 51/5253–5259; H01L 27/3244; H01L 51/56; H01L 51/0026–0028
See application file for complete search history.

(56) References Cited

U.S. PATENT DOCUMENTS

2003/0203210 A1* 10/2003 Graff .................. H01L 51/5256
   428/412
2014/0141191 A1* 5/2014 Lee .................... H01L 31/0481
   428/76
(Continued)

FOREIGN PATENT DOCUMENTS

CN    105514143 A    4/2016
JP    2007-194061 A1    8/2007
(Continued)

OTHER PUBLICATIONS

Office Action dated Sep. 21, 2017 issued in corresponding Korean Application No. 10-2016-0143975.
(Continued)

*Primary Examiner* — Mariceli Santiago
(74) *Attorney, Agent, or Firm* — Morgan, Lewis & Bockius LLP (57) ABSTRACT

An organic light-emitting display device and a method of manufacturing the same are provided. An organic light-emitting display device includes: a light-emitting element on a substrate, and an encapsulation unit on the light-emitting element, the encapsulation unit including: a plurality of inorganic encapsulation layers, at least one of the inorganic encapsulation layers including: a plurality of inorganic insulation layers, and at least one element encapsulation layer between the inorganic insulation layers, the at least one element encapsulation layer including at least one of: a hydrophobic element and an inert element, and at least one organic encapsulation layer between the inorganic encapsulation layers.

9 Claims, 13 Drawing Sheets

(51) Int. Cl.
*H01L 51/56* (2006.01)
*G09G 3/3241* (2016.01)
(52) U.S. Cl.
CPC ...... *H01L 27/3248* (2013.01); *H01L 27/3258* (2013.01); *H01L 27/3262* (2013.01); *H01L 51/5221* (2013.01); *H01L 51/56* (2013.01)

(56) References Cited

U.S. PATENT DOCUMENTS

| | | | |
|---|---|---|---|
| 2015/0031152 A1* | 1/2015 | Choi | H01L 51/56 438/28 |
| 2015/0171367 A1* | 6/2015 | Moon | H01L 51/5253 257/40 |
| 2015/0380683 A1* | 12/2015 | You | H01L 51/5253 257/40 |
| 2016/0104867 A1 | 4/2016 | Lee et al. | |

FOREIGN PATENT DOCUMENTS

| KR | 10-2014-0080245 A | 6/2014 |
|---|---|---|
| KR | 10-2016-0020837 A | 2/2016 |

OTHER PUBLICATIONS

Office Action dated Jan. 28, 2019 issued in corresponding Chinese Application No. 201711033711.9.

* cited by examiner

ORGANIC LIGHT-EMITTING DISPLAY DEVICE AND METHOD OF MANUFACTURING THE SAME

CROSS-REFERENCE TO RELATED APPLICATIONS

This application claims the priority of Korean Application No. 10-2016-0143975, filed on Oct. 31, 2016, the entirety of which is hereby incorporated by reference.

BACKGROUND

1. Technical Field

The present disclosure relates to an organic light-emitting display device and a method of manufacturing the same.

2. Discussion of the Related Art

Thin film transistors (TFT) are used as switching elements and/or driving elements for flat-panel displays. The thin film transistors are divided into thin film transistors using amorphous silicon, thin film transistors using polysilicon, and thin film transistors using an oxide semiconductor, depending on the material for an active layer. Among them, the thin film transistors using an oxide semiconductor have high mobility as compared to thin film transistors using amorphous silicon, and have much lower leakage current and superior reliability as compared to thin film transistors using amorphous silicon and thin film transistors using polysilicon. In addition, thin film transistors using oxide semiconductors have a benefit of securing a more uniform threshold voltage (Vth) distribution than thin film transistors using polysilicon.

A plurality of inorganic films are formed on the thin film transistors using oxide semiconductors. When the inorganic film is formed by plasma-enhanced chemical vapor deposition (PECVD), the hydrogen content in the inorganic film is about 15 to 30%. When the hydrogen present in the inorganic film diffuses into the active layer of the thin film transistor, the diffused hydrogen reacts with oxygen present in the oxide semiconductor, thus changing properties (for example, the threshold voltage) of the thin film transistor, and disadvantageously causing deterioration in reliability of the thin film transistor.

SUMMARY

Accordingly, the present disclosure is directed to an organic light-emitting display device and a method of manufacturing the same that substantially obviate one or more of the issues due to limitations and disadvantages of the related art.

In one aspect, embodiments of the present disclosure may provide an organic light-emitting display device to reduce or prevent deterioration of a thin film transistor, and thereby improve reliability, and a method of manufacturing the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an organic light-emitting display device, including: a light-emitting element on a substrate, and an encapsulation unit on the light-emitting element, the encapsulation unit including: a plurality of inorganic encapsulation layers, at least one of the inorganic encapsulation layers including: a plurality of inorganic insulation layers, and at least one element encapsulation layer between the inorganic insulation layers, the at least one element encapsulation layer including at least one of: a hydrophobic element and an inert element, and at least one organic encapsulation layer between the inorganic encapsulation layers.

In another aspect, there is provided an organic light-emitting display device, including: providing a light-emitting element on a substrate, and providing an encapsulation unit on the light-emitting element, the providing the encapsulation unit including: providing a plurality of inorganic encapsulation layers, the providing at least one of the inorganic encapsulation layers including: providing a plurality of inorganic insulation layers, and providing at least one element encapsulation layer between the inorganic insulation layers, the providing the at least one element encapsulation layer including providing at least one of: a hydrophobic element and an inert element, and providing at least one organic encapsulation layer between the inorganic encapsulation layers.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain various principles of the disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of which are illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Figure 1:
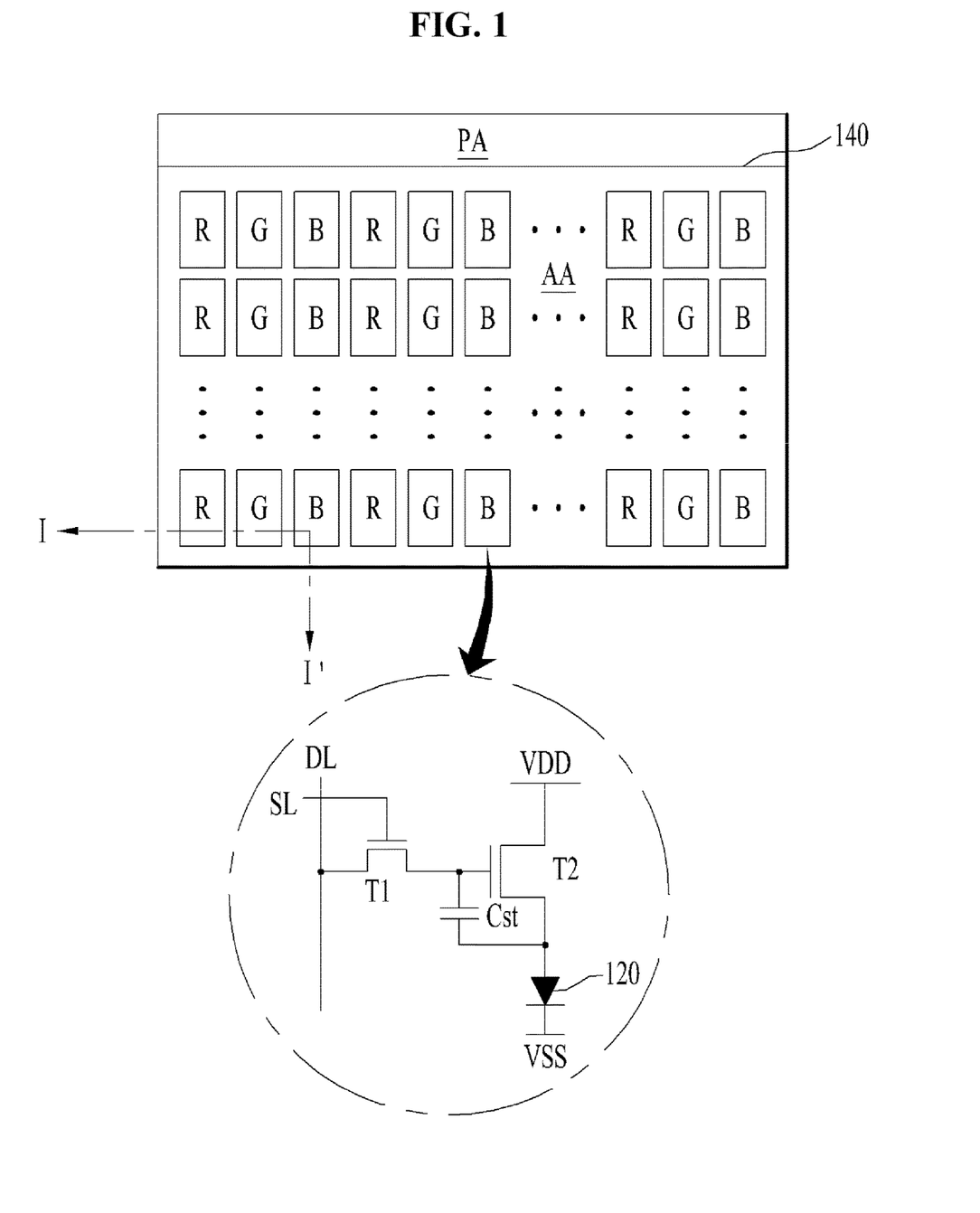
FIG. 1 illustrates an organic light-emitting display device according to an embodiment of the present disclosure.
Figure 2:
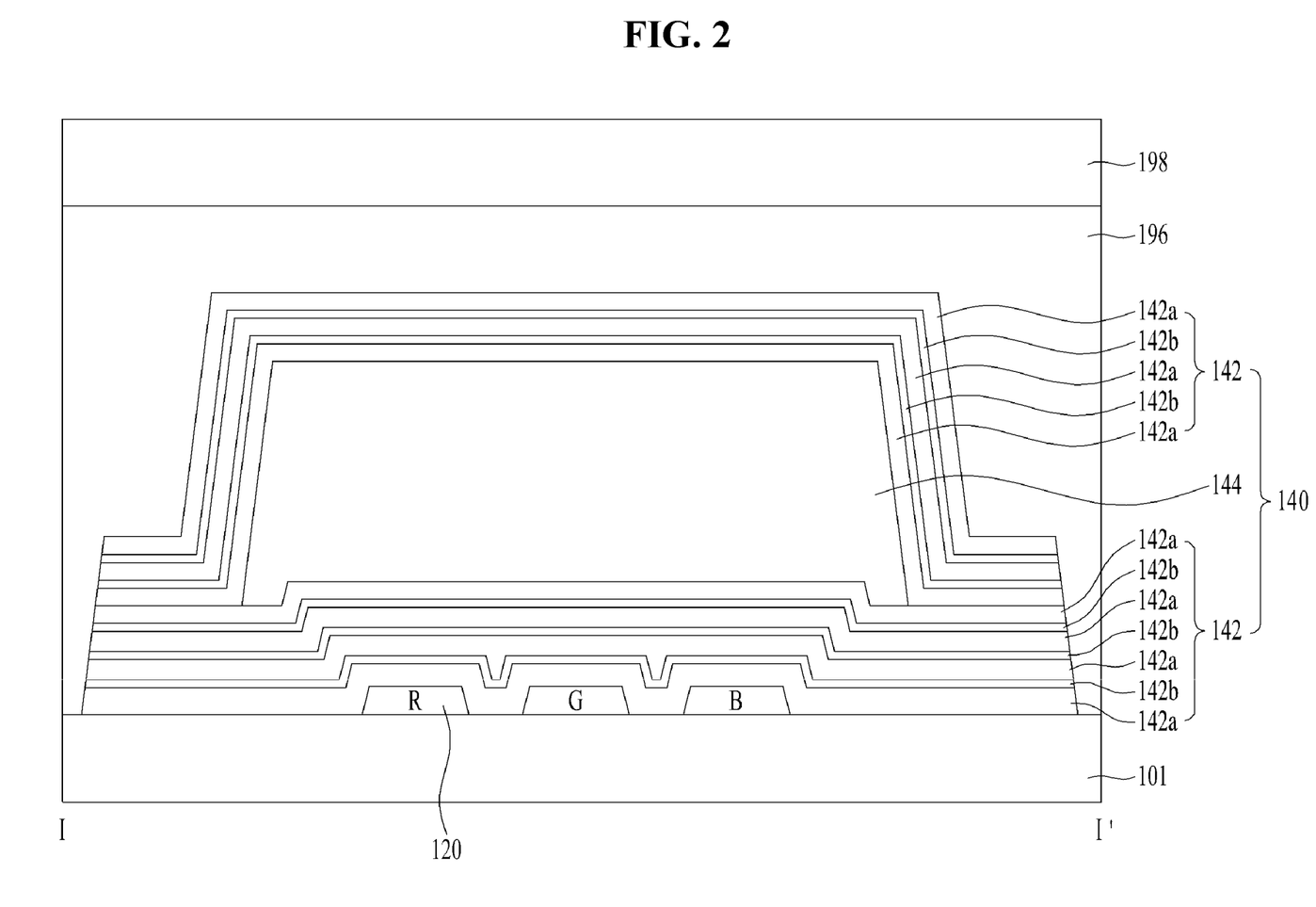
FIG. 2 is a sectional view illustrating the organic light-emitting display device taken along line I-I' of FIG. 1.

FIG. 1 illustrates an organic light-emitting display device according to an embodiment of the present disclosure. FIG. 2 is a sectional view illustrating the organic light-emitting display device taken along line I-I' of FIG. 1.

An organic light-emitting display device according to an embodiment of the present disclosure, as shown in the FIG. 1 example, may include an active area AA and a pad area PA. A plurality of pads may be in the pad area PA. Each of the plurality of pads may supply a driving signal to a scan line SL, a data line DL, a low-voltage supply (VSS) line and a high-voltage supply (VDD) line disposed in the active area AA. The pads may be exposed by an encapsulation unit 140 covering the active area AA. For example, as shown in FIG. 2, a protective film 198 may be attached to the encapsulation unit 140, e.g., through an adhesive layer 196. This protective film may be attached to upper and side surfaces of the encapsulation unit 140. The adhesive layer may be, for example, a pressure-sensitive adhesive (PSA).

The active area AA may display an image through a unit pixel including a light-emitting element 120. The unit pixel may include, for example, red (R), green (G), and blue (B) sub-pixels, or red (R), green (G), blue (B), and white (W) sub-pixels. Each of the sub-pixels may include a pixel driving circuit and a light-emitting element 120 connected to the pixel driving circuit.

The pixel driving circuit may include a switching thin film transistor T1, a driving thin film transistor T2, and a storage capacitor Cst. When a scan pulse is supplied to a scan line SL, the switching thin film transistor T1 may be turned on, and may supply a data signal supplied to the data line DL to the storage capacitor Cst and a gate electrode of the driving thin film transistor T2.

In response to the data signal supplied to the gate electrode of the driving thin film transistor T2, the driving thin film transistor T2 may control a current (I) supplied from the high-voltage power-source (VDD) line 161 to the light-emitting element 130, thereby regulating the amount of light emitted by the light-emitting element 120. In addition, although the switching thin film transistor T1 may be turned off, the voltage charged in the storage capacitor Cst may enable the driving thin film transistor T2 to supply a constant current (I) until the data signal of the next frame is supplied, thereby allowing the light-emitting element 120 to continuously emit light.

Figure 3:
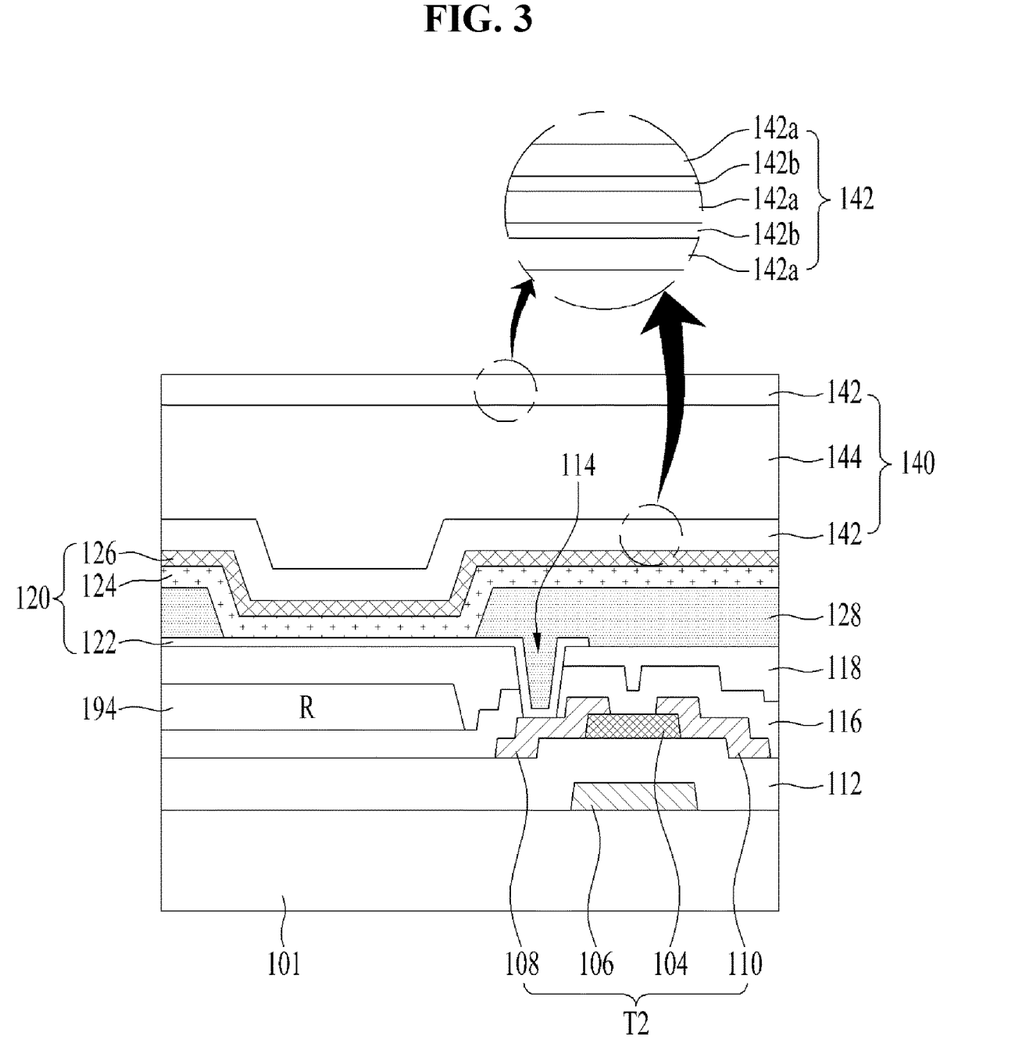
FIG. 3 is a sectional view illustrating an organic light-emitting display device including a driving thin film transistor shown in FIG. 1.

FIG. 3 is a sectional view illustrating an organic light-emitting display device including a driving thin film transistor shown in FIG. 1. FIGS. 4A to 4D are sectional views illustrating an encapsulation unit including an element encapsulation layer according to various embodiments of the present disclosure.

As shown in the FIG. 3 example, the driving thin film transistor T2 may include a gate electrode 106, an active layer 104, a source electrode 108, and a drain electrode 110. The gate electrode 106 may overlap an oxide semiconductor layer 104, and a gate insulation film 112 may be interposed therebetween.

The active layer 104 may overlap the gate electrode 106 on the gate insulation film 112 to form a channel between the source electrode 108 and the drain electrode 110. This oxide semiconductor layer 104 may be formed using an oxide semiconductor including, for example, at least one metal among: zinc (Zn), cadmium (Cd), gallium (Ga), indium (In), tin (Sn), hafnium (Hf), and zirconium (Zr). The thin film transistor T2 including the active layer 104 composed of this oxide semiconductor may have advantages of high charge mobility and low current leakage as compared to a thin film transistor including a polycrystalline semiconductor layer, thus exhibiting short on-time and long off-time. This active layer 104 may be disposed above the gate electrode 106 to effectively secure stability of the thin film transistor T2.

The source electrode 108 and the drain electrode 110 may be a single or multiple layers, including, e.g., any one or more of molybdenum (Mo), aluminum (Al), chromium (Cr), gold (Au), titanium (Ti), nickel (Ni), neodymium (Nd) and copper (Cu), or an alloy thereof, on the gate insulation film 112, but embodiments of the present disclosure are not limited thereto. The source electrode 108 and the drain electrode 110 may face each other such that the channel of the active layer 104 may be interposed therebetween. Meanwhile, an etch stopper (not shown) may be formed on the active layer 105 exposed between the source electrode 108 and the drain electrode 110. The etch stopper may reduce effects of oxygen and moisture on the active layer 105 exposed between the source electrode 108 and the drain electrode 110, thereby reducing or preventing the active layer 104 from being damaged.

The color filter 194 may be disposed on the protective film 116 that may cover the driving thin film transistors T2. Any one of the red, green, and blue color filters 194 may be disposed in each sub-pixel, and these color filters may be alternately disposed. A planarization layer 118 made of an organic insulation material, such as photoacryl, may be formed on the substrate 101 provided with the color filter 194 for planarization. The planarization layer 118 and the protective film 116 may have a pixel contact hole 114 exposing the drain electrode 110. The organic light-emitting element 120 may include an anode 122, at least one light-emitting stack 124 formed on the anode 122, and a cathode 126 formed on the light-emitting stack 124.

The anode 122 may be electrically connected to the drain electrode 110 of the driving thin film transistor T2 exposed through the contact hole 114 penetrating through the planarization layer 118. The light-emitting stack 124 may be formed on the anode 122 of a light-emitting region provided by a bank 128. Each of at least one light-emitting stack 124 may be formed by stacking a hole-related layer, an organic light-emitting layer, and an electron-related layer in this order or reverse order on the anode 122, and may produce white light incident upon the color filter 192. For example, the light-emitting stack 124 may include first and second light-emitting stacks which may face each other via a charge generation layer interposed therebeween. In one example, the light-emitting layer of any one of the first and second light-emitting stacks may generate blue light, and the light-emitting layer of the other of the first and second light-emitting stacks may generate yellow-green light, thereby generating white light through the first and second light-emitting stacks. The cathode 126 may face the anode 122, and the light-emitting stack 124 may be interposed therebetween.

The encapsulation unit 140 may reduce or block permeation of moisture or oxygen to the light-emitting element 120 that may be vulnerable to exterior moisture or oxygen. As such, the encapsulation unit 140 may include a plurality of inorganic encapsulation layers 142 and at least one organic encapsulation layer 144 disposed between the inorganic encapsulation layers 142. The inorganic encapsulation layer 142 may be disposed as the uppermost layer. In one example, the encapsulation unit 140 may include at least two inorganic encapsulation layers 142 and at least one organic encapsulation layer 144.

The at least one organic encapsulation layer 144 may serve as a buffer to relieve stress between respective layers upon bending of the organic light-emitting display device, and may reinforce planarization. The organic encapsulation layer 144 may be formed using an organic insulation material, such as an acrylic resin, an epoxy resin, polyimide, polyethylene or silicon oxycarbon (SiOC). The organic encapsulation layer 144 may be formed in a smaller line width than that of the vertically adjacent inorganic encapsulation layers 142, thus allowing the inorganic encapsulation layer 142 to seal the upper and side surfaces of the organic encapsulation layer 144.

The inorganic encapsulation layers 142 may reduce, minimize, or block permeation of exterior moisture and gas (e.g., hydrogen and/or oxygen) to the thin film transistors T1 and T2, and the organic light-emitting element 120. The inorganic encapsulation layers 142 may be formed to cover the upper and side surfaces of the organic encapsulation layer 144 disposed under the inorganic encapsulation layers 142.

Each of the inorganic encapsulation layers 142 may include a plurality of inorganic insulation layers 142a and at least one element encapsulation layer 142b disposed between the inorganic insulation layers 142a. Each of the inorganic insulation layers 142a may reduce, minimize, or block permeation of exterior moisture and gas (e.g., hydrogen and/or oxygen) to the thin film transistors T1 and T2 and to the organic light-emitting element 120. The total thickness of the inorganic insulation layers 142a may be 100 Å~10,000 Å, and the inorganic insulation layers 142a may have different or identical thickness. For example, when the inorganic insulation layers 142a with a total thickness of 5000 Å is formed, an inorganic insulation layer 142a with a thickness of 500 Å may be repeatedly deposited ten times.

The inorganic insulation layers 142a may be formed using an inorganic insulation material, which may be suitable for deposition at a low temperature, such as silicon nitride ($SiN_x$), silicon oxide ($SiO_x$), silicon oxide nitride (SiON), or aluminum oxide ($Al_2O_3$). Accordingly, because the inorganic insulation layer 142a may be deposited at a low temperature, it may be possible to reduce or prevent the light-emitting stack 124 that may be vulnerable to high temperature from being damaged during deposition of the inorganic insulation layer 142a.

The element encapsulation layer 142b may be formed using at least one of a hydrophobic element and an inert element between the inorganic insulation layers 142a. The element encapsulation layer 142b may be formed by plasma-treating the upper surface of the inorganic insulation layer 142a with at least one of a hydrophobic element gas and an inert element gas after formation of the inorganic insulation layer 142a. As a result, the element encapsulation layer 142b may have a lower silicon (Si) content than the adjacent inorganic insulation layer 142a. The element encapsulation layer 142b having a lower silicon (Si) content may be softer than the inorganic insulation layer 142a, while the inorganic insulation layer 142a may be harder than the element encapsulation layer 142b.

Meanwhile, the hydrophobic element contained in the element encapsulation layer 142b may be based on a carbon-fluorine (CF) element, such as tetrafluoromethane (also known as carbon tetrafluoride) ($CF_4$) or octafluorocyclobutane (also known as perfluorocyclobutane) ($C_4F_8$). The inert element may be, for example, argon (Ar), helium (He), nitrogen ($N_2$), or neon (Ne).

Because the hydrophobic element in the element encapsulation layer 142b may repel moisture or gas (e.g., oxygen and/or hydrogen) provided from the upper part (for example, an outer part) of the element encapsulation layer 142b, the element encapsulation layer 142b can reduce or prevent permeation of moisture or hydrogen gas. In one example, the element encapsulation layer 142b may be thinner than the adjacent inorganic insulation layer 142a. For example, the element encapsulation layer 142b may have a thickness of 1 Å~200 Å. If the thickness of the element encapsulation layer 142b were less than 1 Å, it may be impossible to secure sufficient hydrophobicity to reduce or prevent permeation of exterior moisture or hydrogen gas. In addition, if the thickness of the element encapsulation layer 142b were to exceed 200 Å, the inorganic insulation layer 142a may be peeled from the element encapsulation layer 142b, rather than being formed well thereon, due to stronger hydrophobicity of the element encapsulation layer 142b.

In addition, the inert element in the element encapsulation layer 142b may separate hydrogen and oxygen unstably combined in the inorganic insulation layer 142a, and may discharge the separated hydrogen and oxygen to the outside (for example, a vacuum chamber used for formation of the element encapsulation layer 142b) of the inorganic insulation layer 142a, thereby removing hydrogen and oxygen unstably combined in the inorganic insulation layer 142a. In addition, the inert element deposited on the inorganic insulation layer 142a by plasma treatment may fill pinholes of the inorganic insulation layer 142a, thereby improving hardness of the inorganic insulation layer 142a.

In one example, each element encapsulation layer 142b may be thinner than the adjacent inorganic insulation layer 142a. For example, the element encapsulation layer 142b may have a thickness of 1 Å~200 Å. If the thickness of the element encapsulation layer 142b were less than 1 Å, hydrogen and oxygen bonded unstably in the inorganic insulation layer 142a may not be separated due to weak strength of physical ions produced during plasma treatment, and therefore hydrogen may not be discharged to the outside of the inorganic insulation layer 142a. In addition, if the thickness of the element encapsulation layer 142b were to exceed 200 Å, silicon, hydrogen, and oxygen bonded stably in the inorganic insulation layer 142a may be separated due to high strength of physical ions produced during plasma treatment plasma treatment, and therefore, an insulation of the inorganic insulation layer 142a may thus be deteriorated.

FIGS. 5A to 5E are sectional views illustrating a method of manufacturing the organic light-emitting display device shown in FIG. 2.

The element encapsulation layer 142b can be formed in any structure shown in FIGS. 5A to 5E. The structure of the encapsulation unit 140 according to an embodiment of the present disclosure is not limited to those shown in FIGS. 5A to 5E, and a variety of alternatives are possible.

Figure 4A:
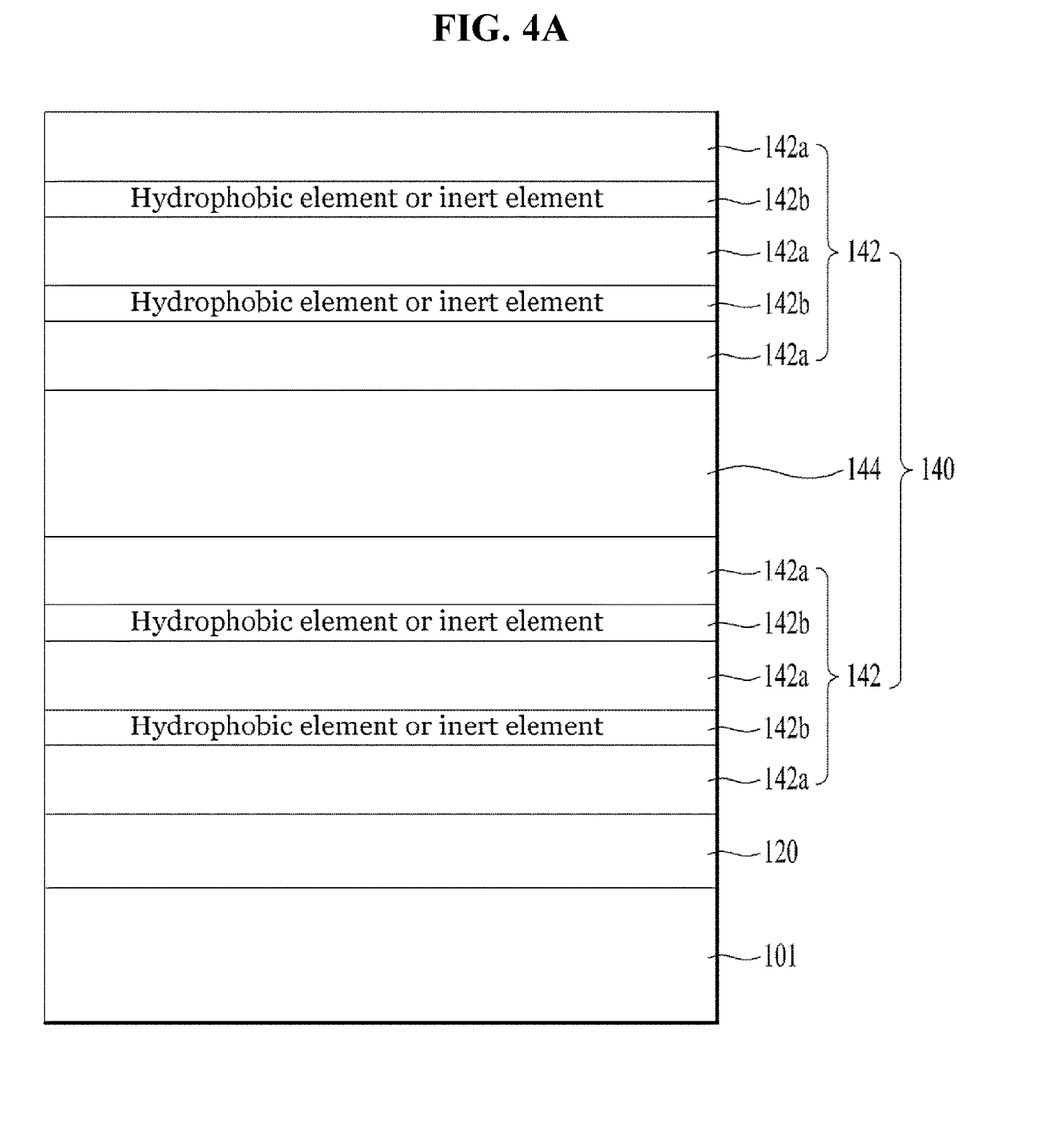
FIGS. 4A to 4D are sectional views illustrating an encapsulation unit including an element encapsulation layer according to various embodiments of the present disclosure.
Figure 4B:
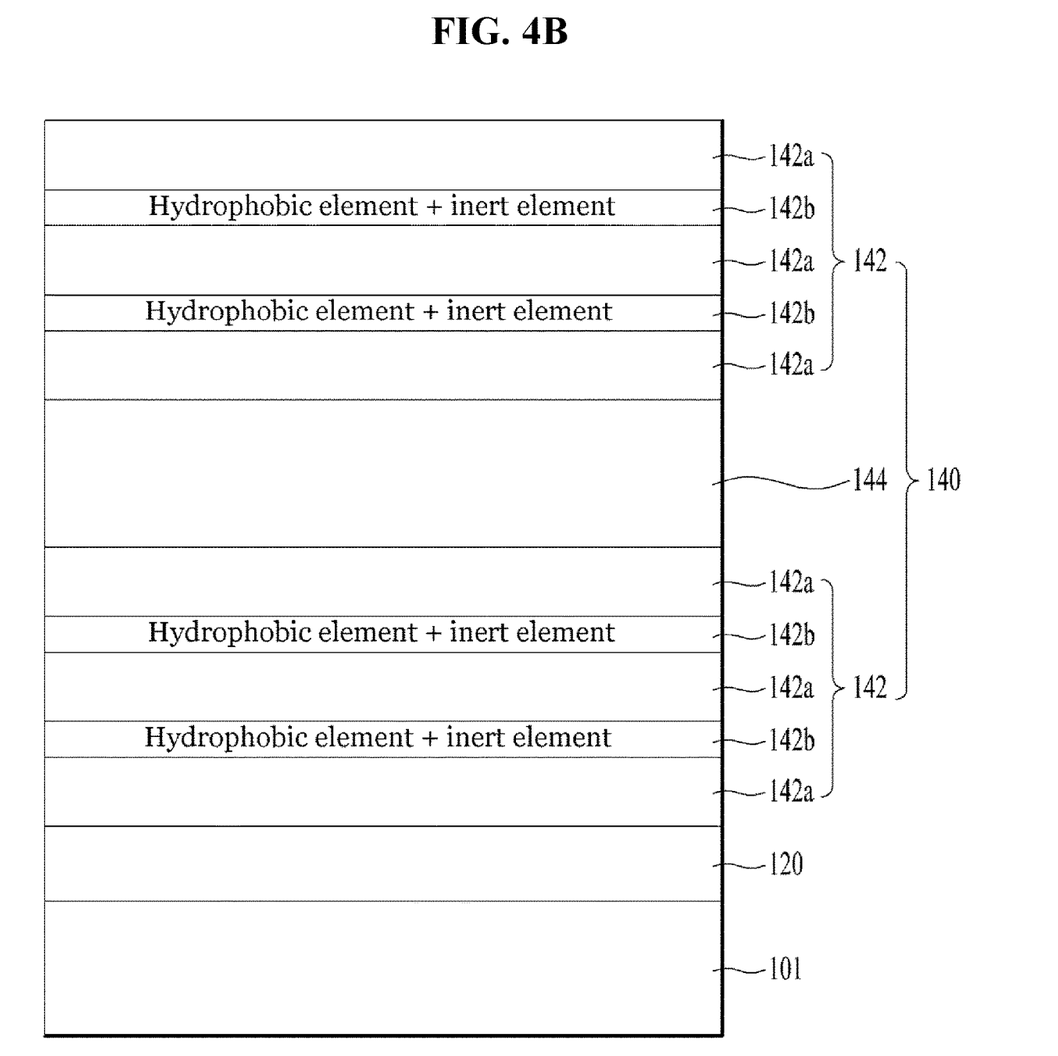

Each element encapsulation layer 142b shown in the FIG. 4A example may be formed using any one single element of a hydrophobic element and an inert element. Each element encapsulation layer 142b shown in the FIG. 4B example may be formed using a combination of at least two elements. For example, each element encapsulation layer 142b may be formed using a combination of a hydrophobic element and an inert element, a combination of different hydrophobic elements, or a combination of different inert elements. For example, the combination ratios of at least two different elements of the respective element encapsulation layers 142b may be different or identical.

Figure 4C:
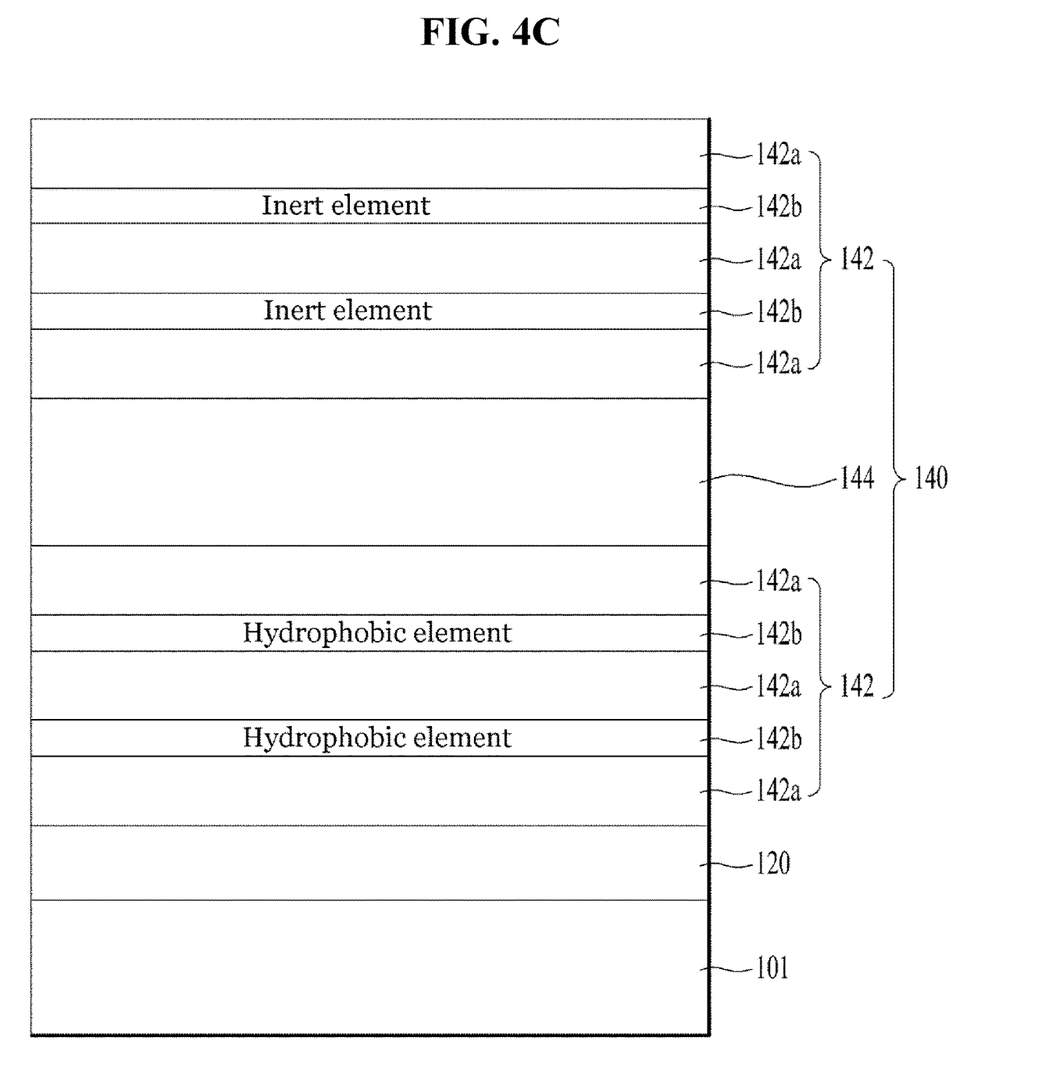

Each element encapsulation layer 142b shown in the FIG. 4C example may be formed using a different material from another element encapsulation layer 142b in the inorganic encapsulation unit 142 that faces the element encapsulation layer 142b via the organic encapsulation layer 144. For example, the element encapsulation layer 142b in the inorganic encapsulation unit 142 disposed under the organic encapsulation layer 144 may be formed using any one of a hydrophobic element and an inert element, and the element encapsulation layer 142b in the inorganic encapsulation unit 142 disposed on the organic encapsulation layer 144 may be formed of the other of the hydrophobic element and the inert element.

Figure 4D:
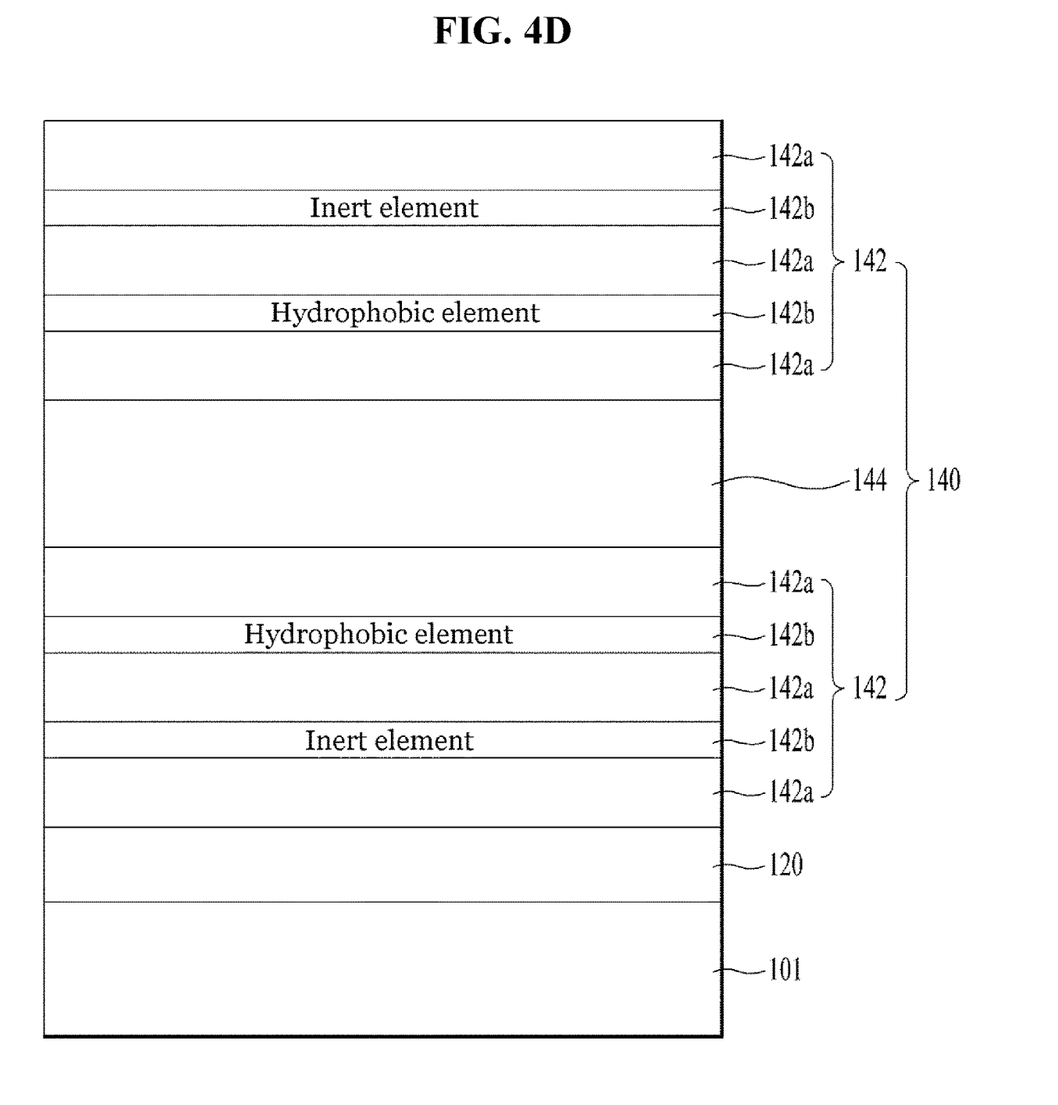

The element encapsulation layer 142b shown in the FIG. 4D example may be formed using a different material from another element encapsulation layer 142b that faces the element encapsulation layer 142b via the organic encapsulation layer 144. For example, the element encapsulation layer 142b disposed under the inorganic insulation layer 142a may be formed using any one of a hydrophobic element and an inert element, and the element encapsulation layer 142b disposed on the inorganic insulation layer 142a may be formed using the other of the hydrophobic element and the inert element.

Table 1 shows results of comparison in initial threshold voltage and threshold voltage after "i" hours (in which "i" represents a positive integer) between the thin film transistor provided with the element encapsulation layer 142a according to an embodiment of the present disclosure and a conventional Comparative Example thin film transistor that is not provided with the element encapsulation layer. As can be seen from Table 1, embodiments of the present disclosure that include the element encapsulation layer 142a formed by plasma treatment using Ar as an inert element and embodiments of the present disclosure that include the element encapsulation layer 142a formed by plasma treatment using a He element can minimize variation in threshold voltage of the thin film transistor in a negative direction, as compared to the Comparative Example. Accordingly, embodiments of the present disclosure can exhibit improved negative bias temperature illumination stress (NBTiS), as compared to the Comparative Example.

TABLE 1

|  | Stress | Vth (V) | ΔVth(V) |
|---|---|---|---|
| Comparative Example | Initial | 1.06 | — |
|  | After i hours | −3.29 | −4.35 |
| The present disclosure (Ar) | Initial | 0.27 | — |
|  | After I hours | −1.96 | −2.23 |
| The present disclosure (He) | Initial | −0.5 | — |
|  | After I hours | −2.25 | −1.75 |

FIGS. 6A to 6E are sectional views illustrating a method of manufacturing an organic light-emitting display device according to an embodiment of the present disclosure.

First, a driving thin film transistor including an active layer made of an oxide semiconductor, and an organic light-emitting element 120 may be formed on a substrate 101. Then, as shown in the FIG. 5A example, an inorganic insulation layer 142a may be formed by a deposition method, such as chemical vapor deposition (CVD), low pressure chemical vapor deposition (LPCVD) or plasma enhanced chemical vapor deposition (PECVD) on the substrate 101 provided with the organic light-emitting element 120. The inorganic insulation layer 142a may be formed, for example, using $SiO_x$, $SiN_x$, or SiON.

Then, the surface of the inorganic insulation layer 142a may be subjected to plasma treatment under vacuum, e.g., within one minute, using any one of a hydrophobic element gas and an inert element gas. Accordingly, an element gas may be adsorbed on the upper surface of the inorganic insulation layer 142a, thereby forming the element encapsulation layer 142b, as shown in the FIG. 5B example. Meanwhile, the plasma treatment for forming the element encapsulation layer 142b can be carried out in the same vacuum chamber as in formation of the inorganic insulation layer 142a, or may be in a different vacuum chamber independent from the vacuum chamber used for formation of the inorganic insulation layer 142a. The deposition process of the inorganic insulation layer 142a and the element encapsulation layer 142b may be repeated at least once, thereby forming an inorganic encapsulation layer 142 with a multilayer structure, as shown in the FIG. 5C example.

Figure 5A:
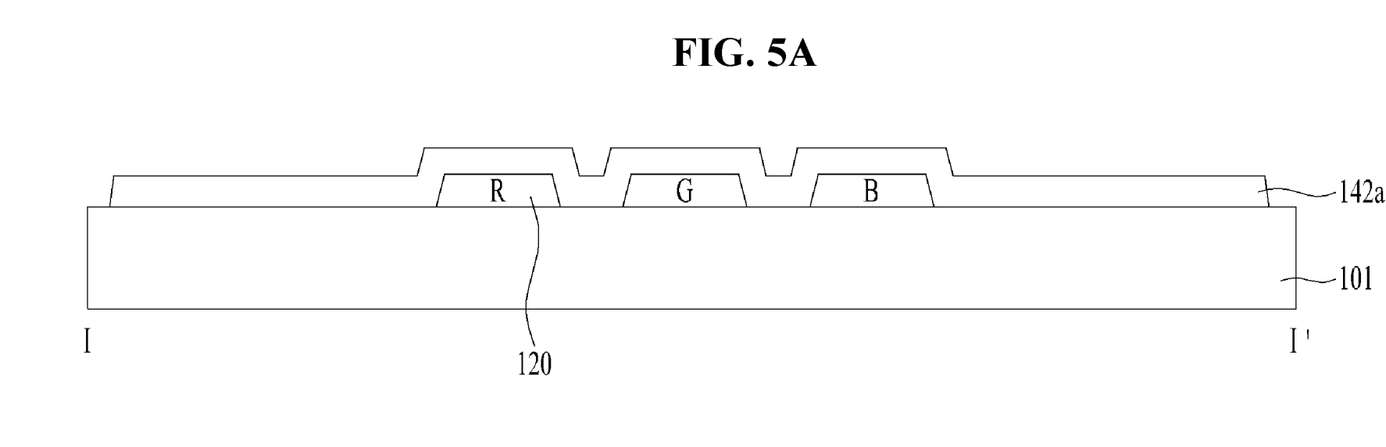
FIGS. 5A to 5E are sectional views illustrating a method of manufacturing the organic light-emitting display device shown in FIG. 2.
Figure 5B:
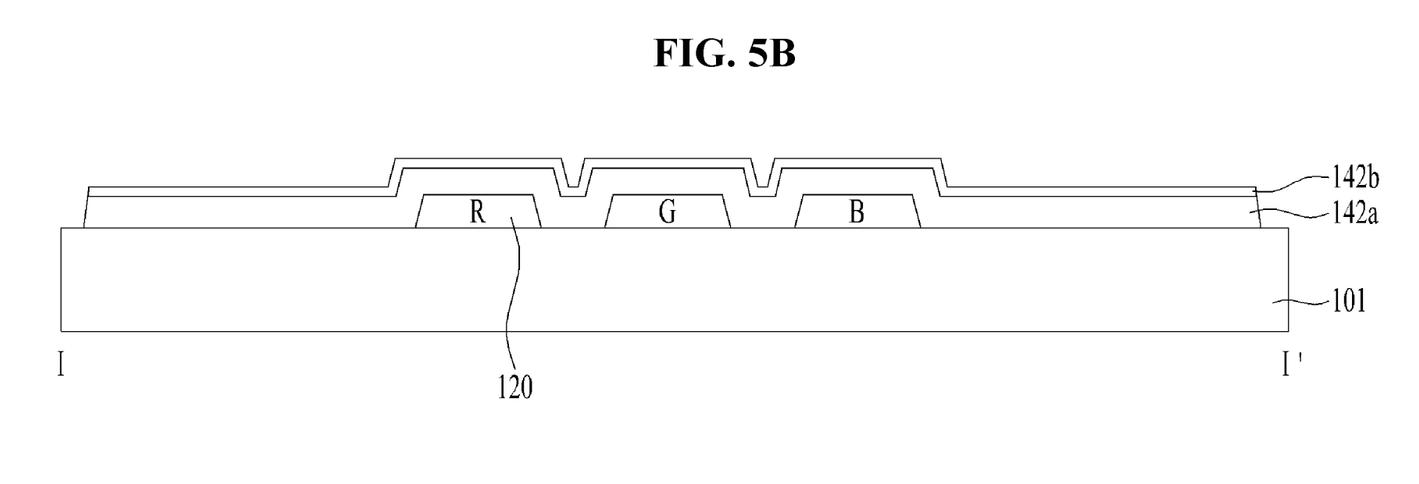
Figure 5C:
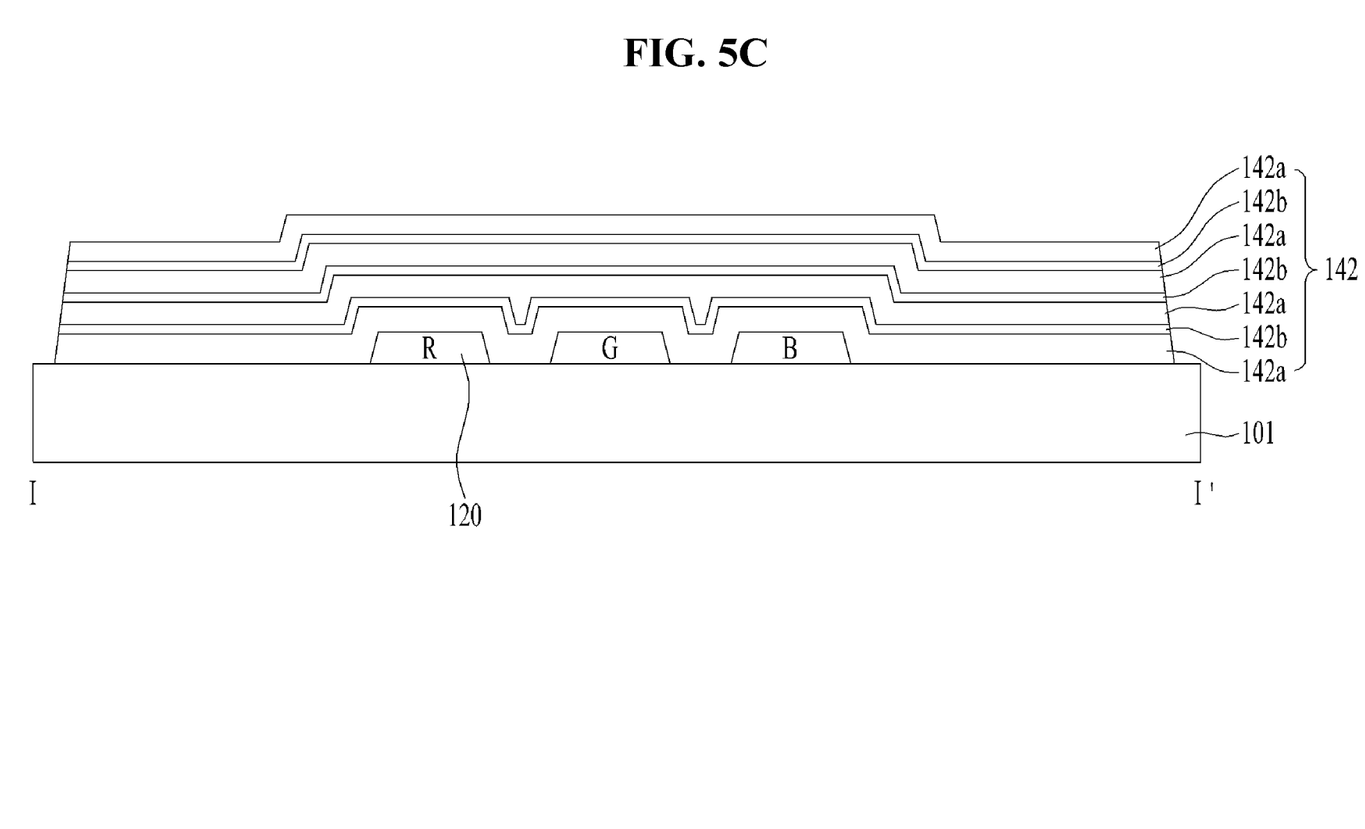
Figure 5D:
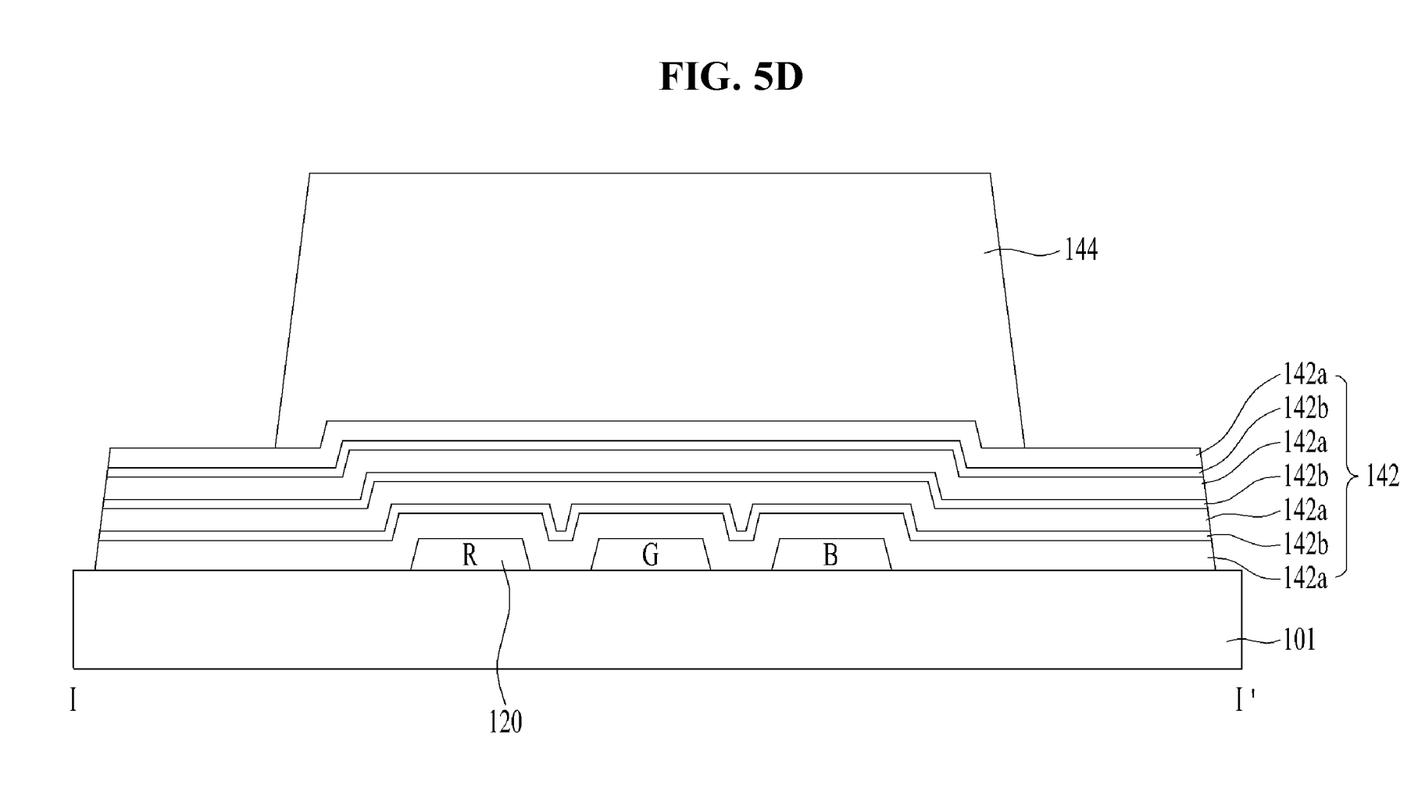

Then, an organic insulation material may be coated on the substrate (provided with the inorganic encapsulation layer 142) to form an organic encapsulation layer 144, as shown in the FIG. 5D example. The organic encapsulation layer 144 may be formed using an organic insulation material, such as an acrylic resin, an epoxy resin, polyimide, polyethylene, or silicon oxycarbon (SiOC).

Figure 5E:
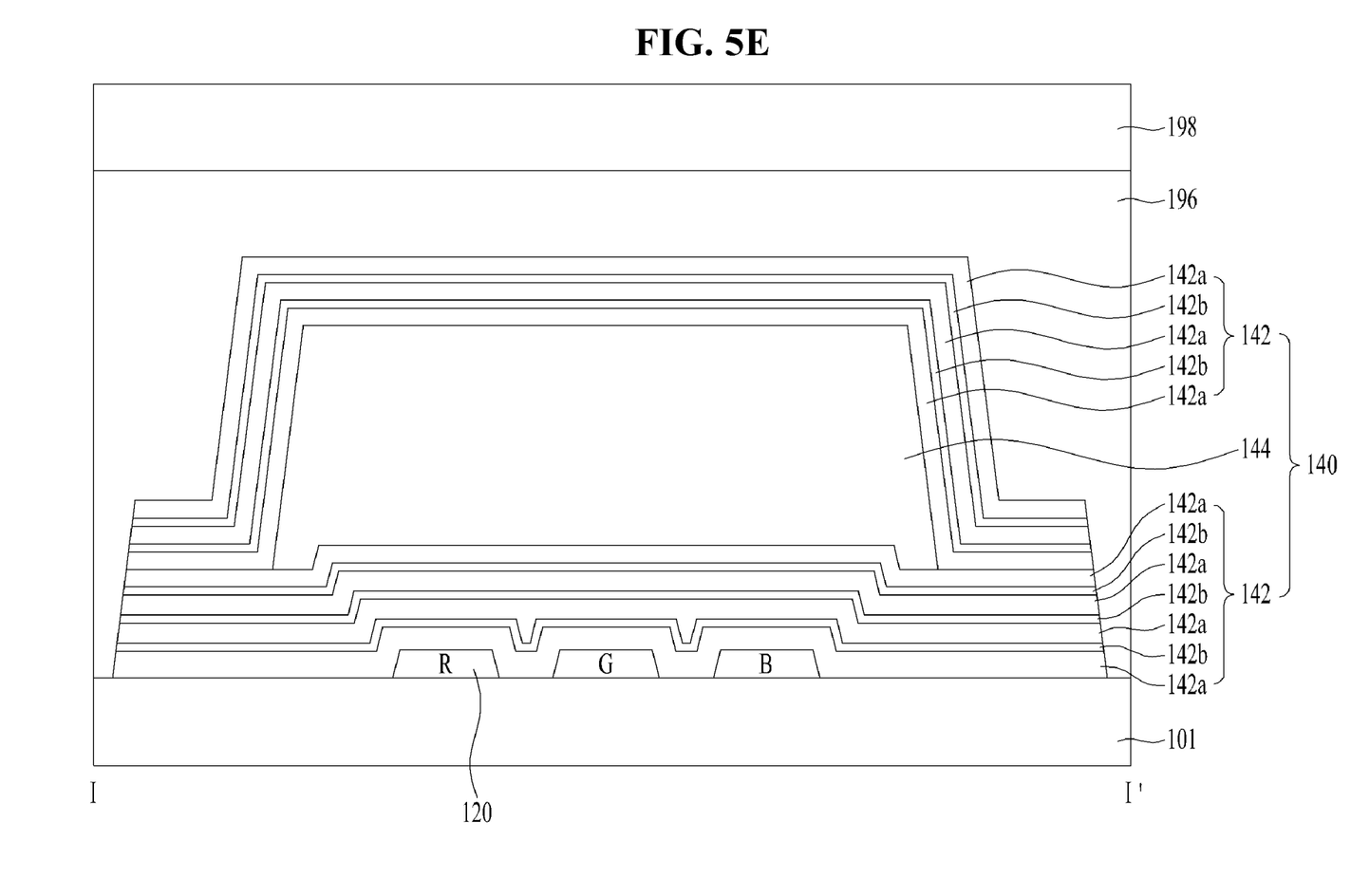

Then, an inorganic insulation layer 142a and an element encapsulation layer 142b may be repeatedly deposited at least once on the substrate 101 provided with the organic encapsulation layer 144, to form an inorganic encapsulation layer 142 with a multiple layer structure, as shown in the FIG. 5E example. Then, a protective film 198 may be attached on upper and side surfaces of the encapsulation unit 140 through the adhesive layer 196.

Figure 6:
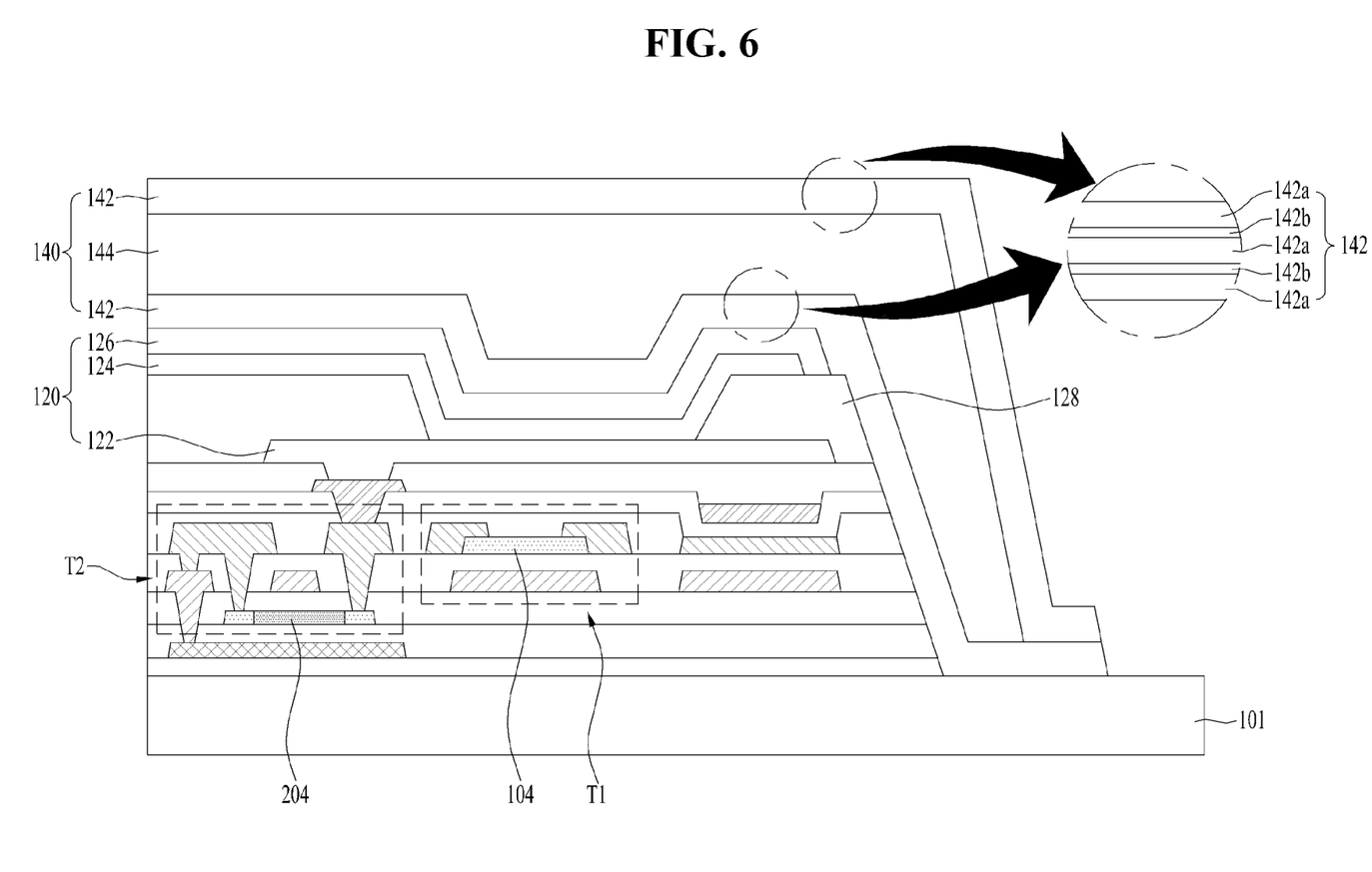
FIG. 6 is a sectional view illustrating an organic light-emitting display device including the inorganic insulation layer and an element encapsulation layer shown in FIGS. 2 and 3 according to another embodiment of the present disclosure.

Although the active layer 104 of the driving thin film transistor T2 being made of an oxide semiconductor has been described as an example, the active layer 204 of the switching thin film transistor T1 may be made of an oxide semiconductor, as shown in the FIG. 6 example. That is, the active layer 204 of the switching thin film transistor T1 shown in FIG. 6 may be made of an oxide semiconductor, and the active layer 104 of the driving thin film transistor T2 may be made of a polycrystalline semiconductor. In addition, at least one driving circuit of a gate driver (not shown) and a multiplexer (not shown) directly formed on the substrate 101 may include a thin film transistor, which may include an active layer made of a polycrystalline semiconductor. The polycrystalline semiconductor layer may have higher mobility (at least 100 cm$^2$/Vs), and thus, may have lower energy consumption and better reliability than an oxide semiconductor layer. Thus, the polycrystalline semiconductor may be suitable for application to the gate driver and/or multiplexer (MUX). As such, an encapsulation unit 140 provided with the element encapsulation layer 142b may be disposed on the switching thin film transistor T1 having an active layer 104 made of an oxide semiconductor shown in FIG. 6, and an encapsulation unit 140 provided with the element encapsulation layer 142b may also be disposed on the driving thin film transistor T2 having an active layer 204 made of a polycrystalline semiconductor. Accordingly, the organic light-emitting display device shown in the example of FIG. 6 may reduce or block permeation of exterior gas, hydrogen, and moisture to the active layers 104 of the switching thin film transistor T1 and the active layer 204 the driving thin film transistor T2 through the element encapsulation layer 142b, thereby reducing or preventing deterioration of the switching thin film transistor T1 and the driving thin film transistor T2.

The organic light-emitting display device according to an embodiment of the present disclosure may include an encapsulation unit including inorganic encapsulation layers and at least one organic encapsulation layer disposed between the inorganic encapsulation layers. Each inorganic encapsulation layer may include an inorganic insulation layer and an element encapsulation layer that may be alternately stacked. The organic light-emitting display device according to an embodiment of the present disclosure may reduce or block permeation of hydrogen and moisture to the thin film transistor through the element encapsulation layer that may include at least one of a hydrophobic element gas and an inert element gas. Accordingly, the organic light-emitting display device according to an embodiment of the present disclosure may reduce or prevent deterioration of the thin film transistor, thereby improving reliability.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A method of manufacturing an organic light-emitting display device, the method comprising:
   providing a light-emitting element on a substrate; and
   providing an encapsulation unit on the light-emitting element, the providing the encapsulation unit comprising:
   providing a plurality of inorganic encapsulation layers, the providing at least one of the inorganic encapsulation layers comprising:
      providing a plurality of inorganic insulation layers; and
      providing at least one element encapsulation layer between the inorganic insulation layers, the providing the at least one element encapsulation layer comprising providing at least one of: a hydrophobic element and an inert element; and
   providing at least one organic encapsulation layer between the inorganic encapsulation layers,
   wherein the element encapsulation layer and the organic encapsulation layer are not in contact with each other.

2. The method of claim 1, wherein:
   the hydrophobic element is based on a carbon-fluorine (CF) element; and
   the inert element comprises at least one of: Ar, He, N$_2$, and Ne.

3. The organic light-emitting display device of claim 2, wherein the carbon-fluorine (CF) element comprises at least one of: $CF_4$ and $C_4F_8$.

4. The method of claim 2, further comprising:
   providing a driving thin film transistor connected to the organic light-emitting element; and
   providing a switching thin film transistor connected to the driving thin film transistor,
   wherein at least one of the driving thin film transistor and the switching thin film transistor comprises an active layer comprising an oxide semiconductor.

5. The method of claim 1, wherein the providing a plurality of inorganic encapsulation layers comprises:
   depositing an inorganic insulation material on the substrate provided with the organic light-emitting element to form the inorganic insulation layer; and
   plasma-treating a surface of the inorganic insulation layer using at least one of the hydrophobic element and the inert element gas to form the element encapsulation layer.

6. The method of claim 5, wherein:
   the hydrophobic element is based on a carbon-fluorine (CF) element; and
   the inert element comprises at least one of: Ar, He, N$_2$, and Ne.

7. The organic light-emitting display device of claim 6, wherein the carbon-fluorine (CF) element comprises at least one of: $CF_4$ and $C_4F_8$.

8. The method of claim 5, further comprising:
   providing a driving thin film transistor connected to the organic light-emitting element; and
   providing a switching thin film transistor connected to the driving thin film transistor,
   wherein at least one of the driving thin film transistor and the switching thin film transistor comprises an active layer comprising an oxide semiconductor.

9. The method of claim 1, wherein the at least one element encapsulation layer is on a side surface of the organic encapsulation layer.

* * * * *